(12) United States Patent
Hung et al.

(10) Patent No.: US 10,809,469 B1
(45) Date of Patent: Oct. 20, 2020

(54) LASER DIODE EDGE ASSEMBLY STRUCTURE FOR THREE-DIMENSIONAL ACTIVE ALIGNMENT IN TRANSMITTER OPTICAL ASSEMBLY

(71) Applicant: Cloud Light Technology Limited, Hong Kong (HK)

(72) Inventors: Vincent Wai Hung, Hong Kong (HK); Vivian Wei Ma, Hong Kong (HK); Wing Keung Mark Mak, Hong Kong (HK); Chih Hsun Lin, Hong Kong (HK)

(73) Assignee: Cloud Light Technology Limited, Hong Kong (HK)

( * ) Notice: Subject to any disclaimer, the term of this patent is extended or adjusted under 35 U.S.C. 154(b) by 0 days.

(21) Appl. No.: 16/373,626

(22) Filed: Apr. 2, 2019

(51) Int. Cl.
*G02B 6/42* (2006.01)
*H01S 5/022* (2006.01)

(52) U.S. Cl.
CPC ......... *G02B 6/4227* (2013.01); *G02B 6/4238* (2013.01); *G02B 6/4245* (2013.01); *H01S 5/02252* (2013.01)

(58) Field of Classification Search
CPC .. G02B 6/4227; G02B 6/4237; G02B 6/4238; G02B 6/4244; G02B 6/4245; H01S 5/0224; H01S 5/02272

USPC .................................................... 385/88, 89
See application file for complete search history.

(56) References Cited

U.S. PATENT DOCUMENTS

| | | | | |
|---|---|---|---|---|
| 6,270,261 | B1* | 8/2001 | Kawano | G02B 6/4204 372/703 |
| 2002/0003231 | A1* | 1/2002 | Sun | B41J 2/45 257/59 |
| 2012/0128290 | A1* | 5/2012 | Han | G02B 6/4206 385/14 |
| 2015/0346442 | A1* | 12/2015 | Tamura | G02B 6/4215 385/24 |

* cited by examiner

*Primary Examiner* — Robert Tavlykaev

(57) ABSTRACT

A method and a system for active alignment of a light source assembly along three dimensions in an optical bench plane are provided. The light source assembly, preferably a laser diode on its sub-mount, is actively aligned in three dimensions, longitudinal, transection and vertical along the optical bench. The light source assembly is attached on edge of the optical bench, via adhesion processes, such as solder welding. Optical components such as collimator lens, isolator, etc are first passively aligned on the optical bench using alignment marks and epoxy slots provided on the surface of the optical bench. Then, laser diode, mounted on a laser diode sub-mount, is aligned in X and Z direction. Thereafter, the light source assembly is pushed towards the edge of the optical bench and attached with the edge via a solder joint. Also, a compensator can be actively aligned until the optimum light intensity achieved.

18 Claims, 14 Drawing Sheets

LASER DIODE EDGE ASSEMBLY STRUCTURE FOR THREE-DIMENSIONAL ACTIVE ALIGNMENT IN TRANSMITTER OPTICAL ASSEMBLY

FIELD

The present disclosure generally relates to an assembly of an optical transceiver in the optical communication systems. More particularly, the present disclosure relates to the active alignment method for packaging a transmitter optical subassembly.

BACKGROUND

In the era of information, there is no doubt that information technology has an exponential growth through the modern communication systems. Optical fiber communication plays a vital role in the development of high quality and high-speed telecommunication systems. A modern optical communication network is constructed by transmitting and receiving circuitry, responsible for optical signal transmission by converting electrical signal to optical signal and vice versa. Data center, as a hub of the modern communication network, is spurring growth in the market by the Internet and clouding computing requirement. Along with the constant upgrade and anticipation of optical interconnection speed and density, anxiety to have the systematic design of the data center with the high calculation ability, storage ability and interconnection ability increases. Now the considerations are focusing on the parallel single mode 4-channel optical transceiver (PSM4) technology and coarse wavelength division multiplexing 4-wavelength (CWDM4) technology for the 100G Ethernet in data center.

As the supplement of multi-mode 100G data center, PSM4 technology uses the single-mode MPO fiber transmission to reach more than 2KM transmission distance by employing 4 fiber quantity. CWDM4 technology also shows its advantage as an alternative replacement under the situation of the limit of fiber resources. The key components in these two technologies are the transmitter and receiver. Normally, transmitter optical subassembly (abbreviated as TOSA) is the integrated transmitter package system which ensures the transceiver to transfer the electric signal to the optical signal.

In order to reduce the power loss during the optical signal transmitting in the optical system, the alignment accuracy of each optical component in the TOSA assembly is significantly important. As we know in single mode transmission, the laser light source has a mode size of only a few microns, and the core of an optical fiber just has approximate 8 μm in diameter, so aligning the light to the single mode fiber with good coupling is the major challenge. Now active alignment, meaning the optical system properties in function are used as a feedback for closed loop control, is a promising technology in the TOSA assembly. Active alignment along the surface of an assemble sub-mount is relatively easy. But how to add the active aligning direction perpendicular to the sub-mount surface i.e., to achieve the three-dimensional active alignment, is still a difficult technology for mass production implementation Hence, there exists a need to achieve three-dimensional active alignment in an assembly sub-mount, along an optical bench, for aligning the light from a light source, in single mode transmission and multi-mode optical transmission.

SUMMARY

The present disclosure overcomes the above mentioned problems with conventional optical transmission system.

The present disclosure provides a method and a system for active alignment method for packaging a transmitter optical subassembly Therefore, it is an objective of the present disclosure to provide a method and a system for actively aligning an assembly of light source to an optical bench in three-dimensions, including X-, Y- and Z-directions along optical bench.

It is an objective of the present disclosure to provide a method and a system for actively aligning an assembly of light source in three dimensions, along with active alignment of one or more optical components, such as compensators, in an optical transmission.

It is also an objective of the present disclosure to provide an edge assembly light source structure which is actively aligned along the edge of an optical bench, using solder welding processes on the edges of the optical bench and the light source assembly too.

It is further an objective of the present disclosure to provide active alignment method for single channel PSM4 and multiple channeled CWDM.

An embodiment of the present disclosure provides a system in optical transmission for packaging a transmitter optical assembly comprising: an optical bench provided with multiple alignment marks and slots on a top surface of the optical bench for aligning and securing multiple optical components; a first edge of the optical bench coated, at least partially, with an adhesion material; and a light source assembly mounted with a light source, and having an opposite second edge coated, at least partially, with a coating metal, wherein the light source assembly is actively aligned along three dimensions in an optical path, the actively aligning of the light source assembly includes: (a) actively aligning, the light source assembly in X and Z direction along the optical path, by moving the light source in the X and Z direction for aligning with multiple optical components that are passively aligned on the multiple alignment marks provided on the optical bench; and (b) pushing the light source assembly, along the actively aligned position of step (a), towards the first edge of the optical bench from the opposite second edge of the light source assembly, for making an adhering contact between the optical bench and the light source assembly, across the first and the opposite second edges of the optical bench and the light source assembly respectively, using an adhesion process.

Another embodiment of the present disclosure provides a method packaging a transmitter optical subassembly implementing active alignment, the method comprising aligning multiple optical components on multiple alignment marks and slots provided on a top surface of an optical bench, the aligning of the optical components include aligning the optical components passively along an optical path; coating, at least partially, a first edge of the optical bench with an adhesion material; coating, at least partially, an opposite second edge of a light source assembly mounted with a laser diode, with a coating metal; actively aligning the light source assembly in X and Z direction along the optical path, by moving the laser diode in the X and Z direction for aligning with multiple optical components that are passively aligned on the multiple alignment marks provided on the optical bench; and pushing the light source assembly, along the actively aligned position of the light source assembly, towards the first edge of the optical bench from the opposite second edge of the light source assembly, for making an adhering contact between the optical bench and the light source assembly, across the first and the opposite second edges of the optical bench and the light source assembly respectively, using an adhesion process.

The foregoing and other objects, features and advantages of the disclosure will be apparent from the following more particular descriptions of exemplary embodiments of the disclosure.

DETAILED DESCRIPTION

This patent describes the subject matter for patenting with specificity to meet statutory requirements. However, the description itself is not intended to limit the scope of this patent. The principles described herein may be embodied in many different forms.

Illustrative embodiments of the disclosure now will be described more fully hereinafter with reference to the accompanying drawings, in which some, but not all embodiments of the disclosure are shown. Indeed, the disclosure may be embodied in many different forms and should not be construed as limited to the embodiments set forth herein; rather, these embodiments are provided so that this disclosure will satisfy applicable legal requirements. Like numbers refer to like elements throughout.

The present disclosure provides a method and a system for active alignment of optical transceiver, and active alignment method for packaging of a transmitter optical subassembly. The method includes actively aligning a light source assembly in an optical system in three-dimension directions along an optical bench. The method, optionally also includes actively aligning one or more optical components, such as compensators on surface of the optical bench. In the present method, the light source assembly is actively aligned three-dimensionally to the optical bench, by attaching the light source assembly along the edge of the optical bench that can be aligned even in vertical direction of the plane along with longitudinal and transection direction. The light source assembly may be attached at the edge of the optical bench using adhesion processes such as solder welding process after being actively aligned to the optical bench. The materials used in adhesion process are including not limited to titanium (Ti), titanium tungsten (TiW), chromium (Cr), gold (Au), etc. To improve the adhesion of the solder to the edge of optical bench, multiple metal layer Ti/Au are deposited first, TiW/Au and Cr/Au can be the alternative layer combinations. Gold layer is used for solder wetting during welding process. The present active alignment method can be implemented to both single channel and multiple channel TOSA assembly.

Figure 1A:
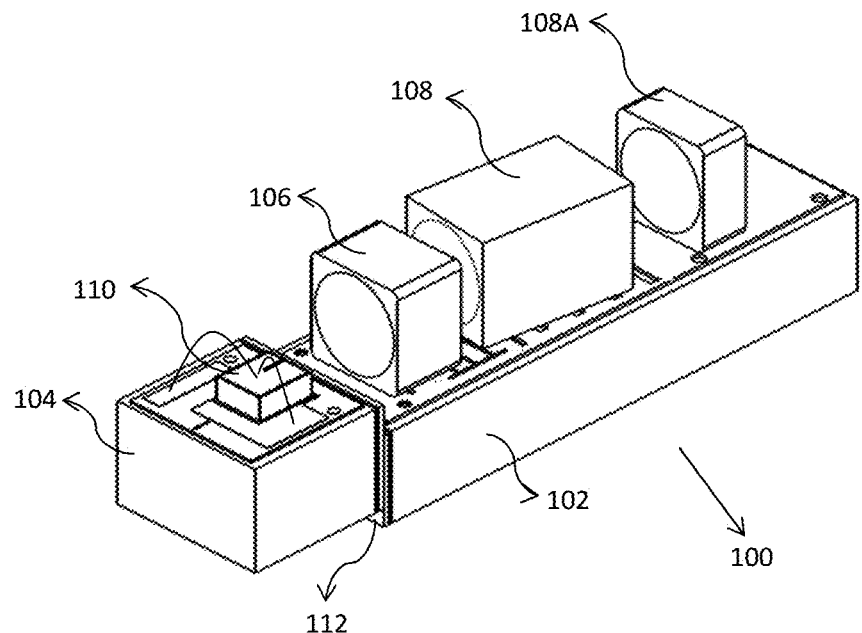
FIGS. 1A and 1B illustrates an exemplary environment showing perspective view and side view, respectively, of a transmitter optical subassembly, in accordance with an embodiment of the present disclosure.
Figure 1B:
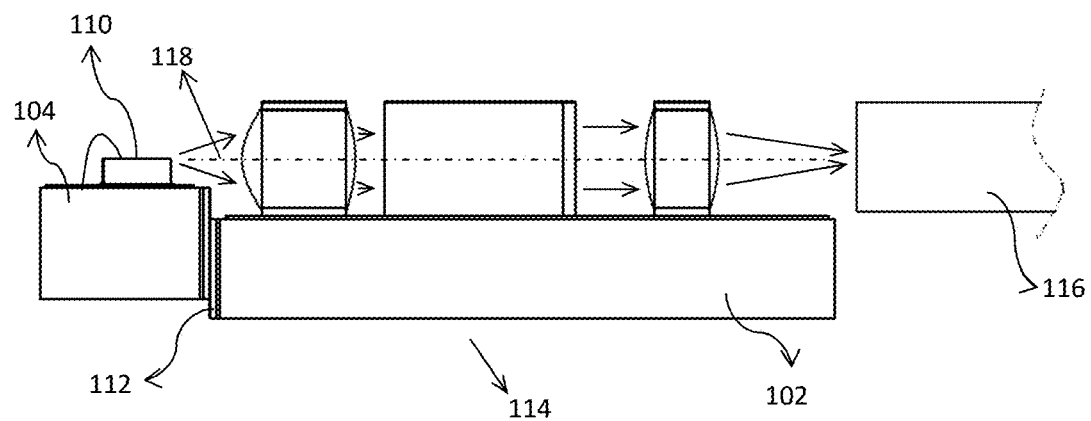

FIGS. 1A and 1B illustrates an exemplary environment showing perspective view and side view, respectively, of a transmitter optical subassembly, in accordance with an embodiment of the present disclosure. FIG. 1 shows the single channel TOSA 100 including an optical bench 102 which is a platform for all the assembled optical components and a light source assembly 104. In a preferable embodiment, silicon is the preference material for the bench. On the surface of the optical bench 102, plurality of necessary optical components are deposited, such as including and not limiting to a collimate lens 106, an isolator 108, and other optical components (108A). The light source 110 may be a laser diode 110. The light from the light source assembly 104 is guided and focused by the optical components on the optical bench 102 in order to enter an optical fiber precisely. In an embodiment, the optical components can be sets with different optical path manipulation, for example a collimator lens set with an isolator 108, or focus lens only. The light source assembly 104 is attached to the optical bench 102 on an edge 112 of the optical bench 102. As shown in FIG. 1B in the side view 114 of the optical bench 102, the light source assembly 104 is assembled on the edge 112 of the optical bench 102 which allows a three-dimensional alignment to be implemented, and is explained further in the description. The light from the light source 110 enters an optical fiber 116 following an optical path 118, through a number of optical components.

Figure 2A:
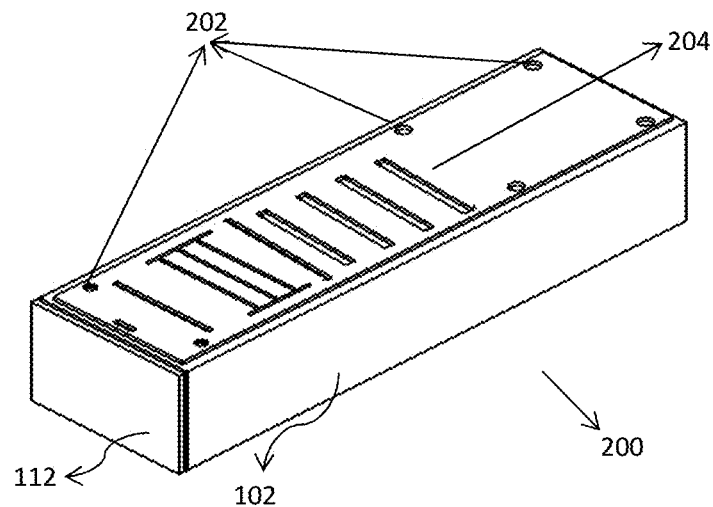
FIGS. 2A and 2B illustrate an exemplary environment showing the optical bench in its perspective view and side view respectively, in accordance with an embodiment of the present disclosure.
Figure 2B:
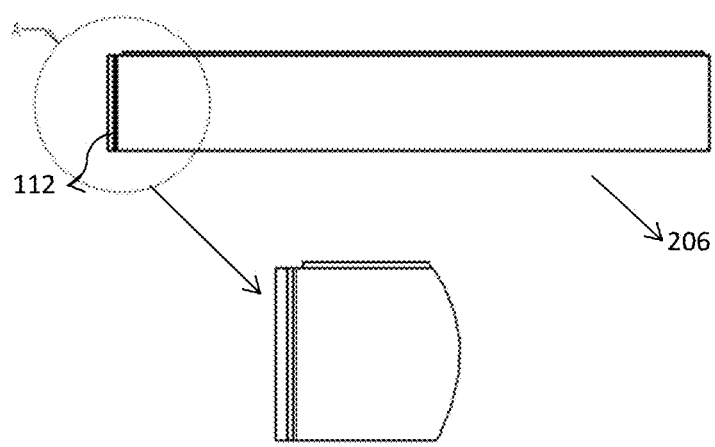

FIGS. 2A and 2B illustrate an exemplary environment showing the optical bench in its perspective view and side view respectively, in accordance with an embodiment of the present disclosure. In FIG. 2A, the perspective view 200 of the optical bench 102 shows multiple alignment marks 202 and adhering slots 204 for an adhesive material on top surface of the optical bench 102. An alignment mark 202 is used for aligning an optical component passively on the top surface of the optical bench 102. The optical components, such as isolator, collimator etc., are fixed on the optical bench 102 using an adhesive material, for example epoxy. This adhesive material can be deposited in the slots 204 for securing optical components on the surface of the optical bench 102. These slots 204 are used to accommodate the adhesive material, such as epoxy in order to fix the optical components on the surface of the optical bench 102 without affecting vertical assemble position of the optical components due to thickness of the adhesive material. These slots 204 may be referred to as epoxy slots 204 further in the description, but does not restrict the adhesive material to epoxy for fixing the optical components to the optical bench 102.

Further for active alignment of the light source assembly in three-dimensions, the light source assembly is attached on the edge 112 of the optical bench 102. As shown in the side view 206 in FIG. 2B, on the edge 112 of the optical bench 102, for attaching the light source assembly, multiple layers of adhesion material are deposited on whole surface of the edge 112 first, in accordance with an embodiment. Enlarged view A of the edge 112 of the optical bench is also shown in FIG. 2B. To improve the adhesion of the soldering material to the edge 112 of the optical bench 102, multiple layers of an adhesive metal are deposited first. The adhesive metal layer may be of metals including and not limiting to Ti/Au, TiW/Au and Cr/Au. Further, gold layer is used for solder wetting during welding process.

In a preferable embodiment, material of the optical bench is silicon due to its stability and batch fabrication process for making all the alignment marks 202 and epoxy slots 204.

Figure 3A:
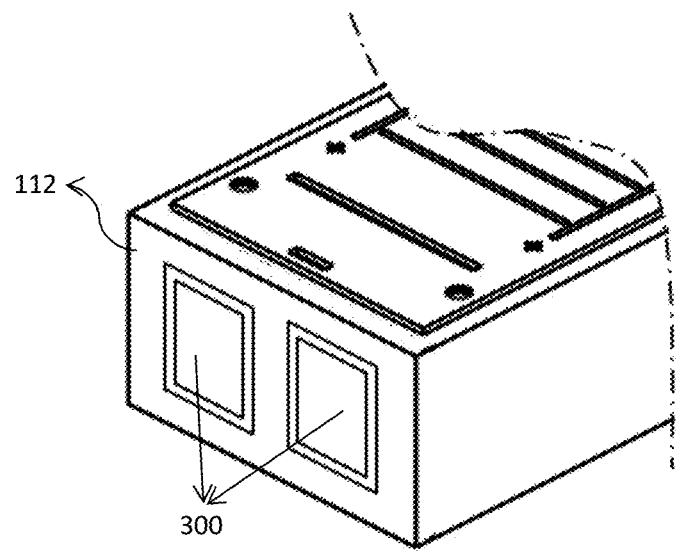
FIGS. 3A and 3B illustrate an exemplary environment showing edge of the optical bench with patterned solder, in accordance with an embodiment of the present disclosure.

FIG. 3A illustrates an exemplary environment showing edge of the optical bench with patterned solder, in accordance with an embodiment of the present disclosure. In FIG. 3, show edge 112 of the optical bench 102 may also be provided with patterned solder 300 to attach the light source assembly with the optical bench. Patterned solder 300 are different from depositing the whole layer of solder on the edge in FIG. 2B.

Figure 3B:
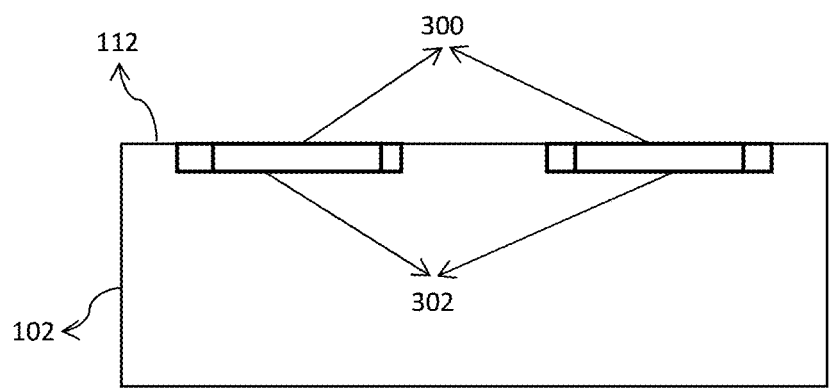

For providing the patterned solders on the edge 112 of the optical bench 102, the edge surface 112 has recesses 302 for accommodation of solder material, as shown in the FIG. 3B. In an embodiment, the depth of the recesses 302 inside the optical bench 102 may be preferably 2 μm. Therefore, a soldering material 300 with an appropriate thickness, such as of 2 μm is deposited and patterned only inside the recess area 302. Hence, the soldering material 300 is imbedded into the recesses 302 without extruding out of the edge surface 112. It may be appreciated by a person skilled in the art that the solder may be patterned in any required number, and is not restricted to just 2 patterns, as shown in FIG. 3A, without deviating from the meaning and scope of the present disclosure. During the welding process, the recess 302 prevents the solder overwhelm on the surface of edge 112, so the solder is melted in the edge 112 only and makes an adhesion joint between the optical bench 102 and the light source assembly 104 at the edge 112 of the optical bench 102. This way of attaching the light source assembly 104 with the optical bench 102 can control the distance between the optical bench 102 and the light source assembly 104, and is not affected by the solder thickness.

Figure 4A:
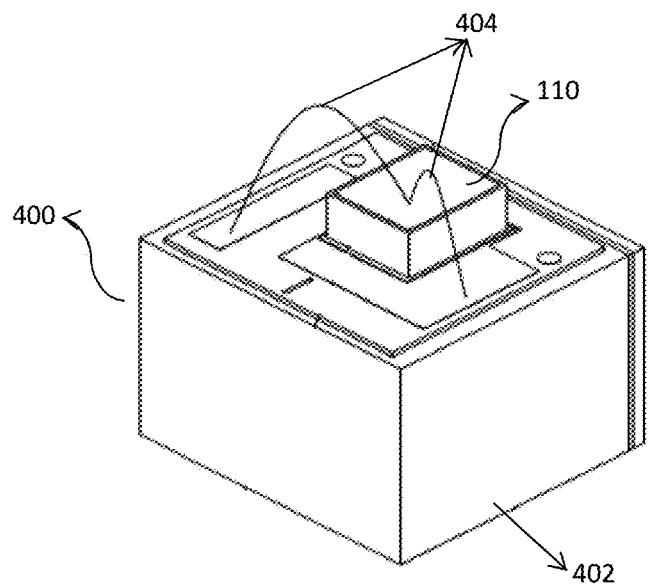
FIGS. 4A, 4B and 4C illustrate an exemplary environment showing a perspective view of a light source assembly, a top view and a side view of a light source sub-mount of the light source assembly, in accordance with an embodiment of the present disclosure.
Figure 4B:
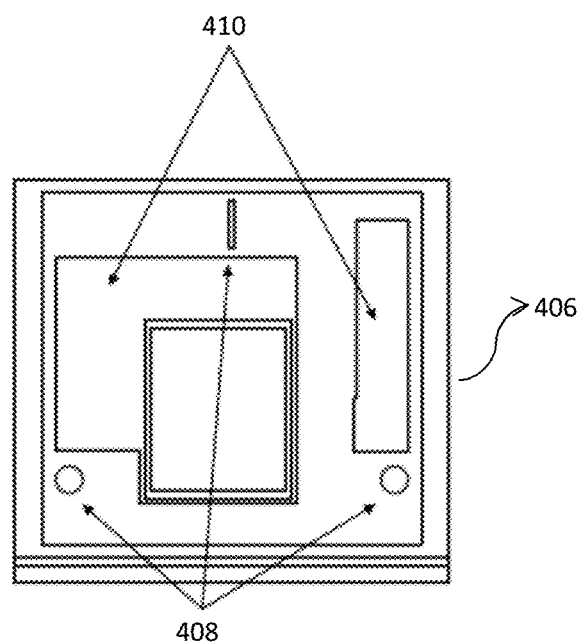
Figure 4C:
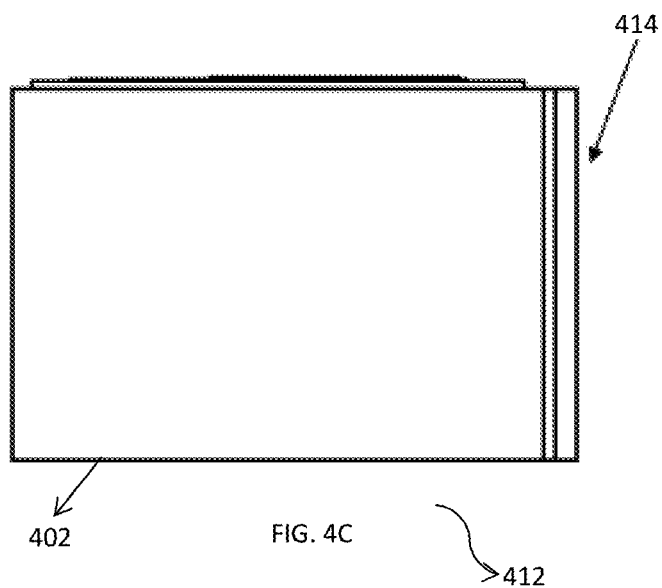

FIGS. 4A, 4B and 4C illustrate an exemplary environment showing a perspective view of the light source assembly, a top view and a side view of a light source sub-mount of the light source assembly, in accordance with an embodiment of the present disclosure. The light source sub-mount is preferably made of silicon. It may be appreciated by a person skilled in the art that light source sub-mount may be made of other possible materials other than Silicon, without deviating from the meaning and scope of the present disclosure. The perspective view 400 shows the light source sub-mount 402 with the light source 110 connected with wire bonds 404 with the sub-mount 402. Referring to the FIG. 4B, the top surface 406 are provided with multiple alignment marks 408 for the light source sub-mount 402. The top surface 406 also shows metal pads 410 for die attach and wire bonds 404. With different configuration of the metal pattern/trance on the sub-mount 402, the light source (laser diode) assembly 104 can be constructed by both DML and EML.

Referring to FIG. 4C, as shown in the side view 412, an edge 414 of the light source sub-mount 402, for light emission, is coated with a coating metal. The coating may be single coated metal layer or multiple metal layers. The coating metal may be including and not limited to titanium, titanium tungsten, chromium, gold, etc. The titanium, titanium tungsten or chromium is used as an adhesion layer and the gold is used as a wetting surface for a solder joint between the light source sub-mount 402 with the optical bench 102. These multiple layers of coating metal are coated first on the edge 414 of the light source sub-mount 402. Then the light source, preferably a laser diode, is deposited on the top surface 406 of the light source sub-mount 402 by die attach and connected to the metal pad by wire bonds 404. Hence, the light source assembly 104 is ready.

Figure 5A:
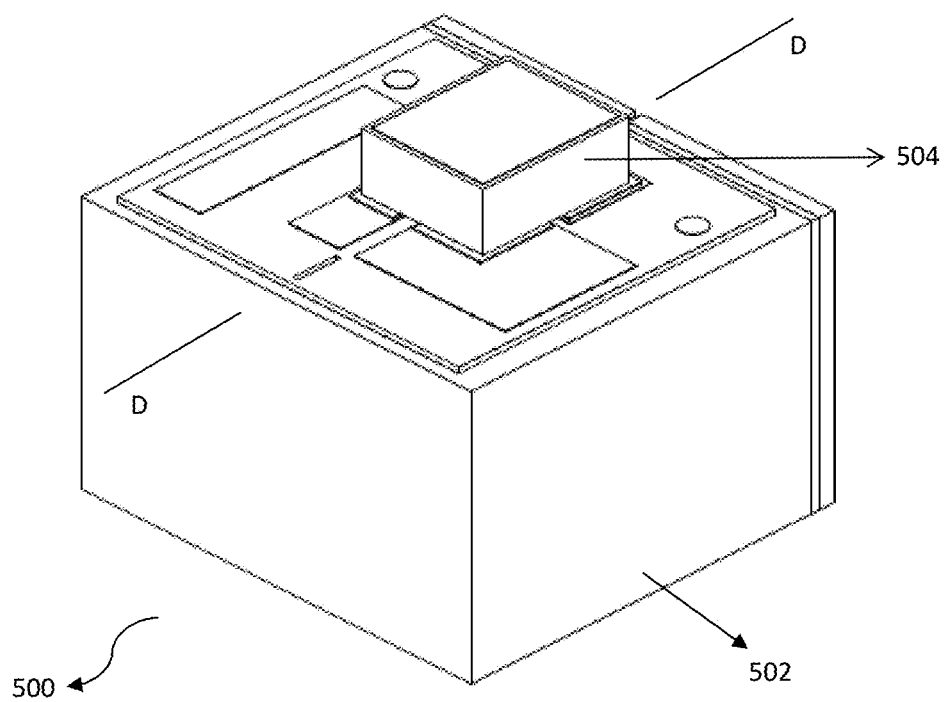
FIGS. 5A and 5B illustrate an exemplary environment including an embodiment of light source assembly which can be used in the three dimensional active alignment, in accordance with an embodiment of the present disclosure.
Figure 5B:
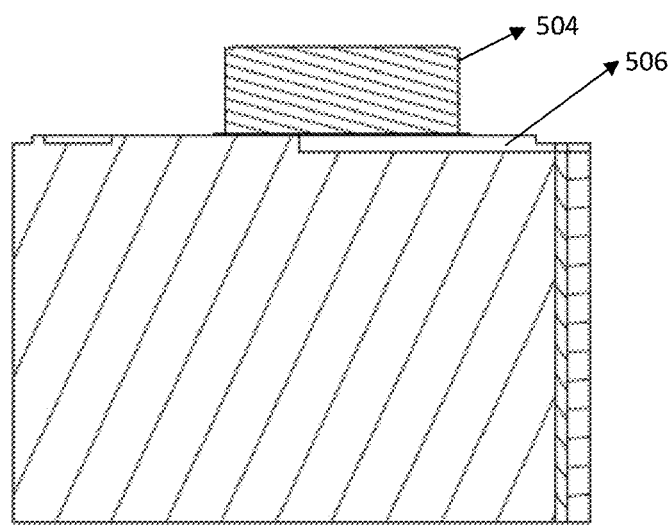

FIGS. 5A and 5B illustrate an exemplary environment including an embodiment of light source assembly which can be used in the three dimensional active alignment, in accordance with an embodiment of the present disclosure. The FIG. 5A shows a light source assembly 500, which includes a sub-mount 502 with a light source 504, such as the laser diode chip 504. The light ejecting from the laser diode on the chip 504 goes through a waveguide, the waveguide is arranged in a recess 506 near the surface of the sub-mount 502 (as shown in the FIG. 5B, which is cross sectional view, along section D-D of the light source assembly 500). In order to increase the heat dissipation for laser diode chip 504 during operation, the laser diode chip 504 can be flip-chipped, as shown in the FIG. 5A, mounted on the sub-mount 502 by using eutectic bonding between corresponding metal pads. The heat from waveguide on the surface of the laser diode chip can pass to the sub-mount 502 with a short path which is having high thermal conductivity.

Figure 6A:
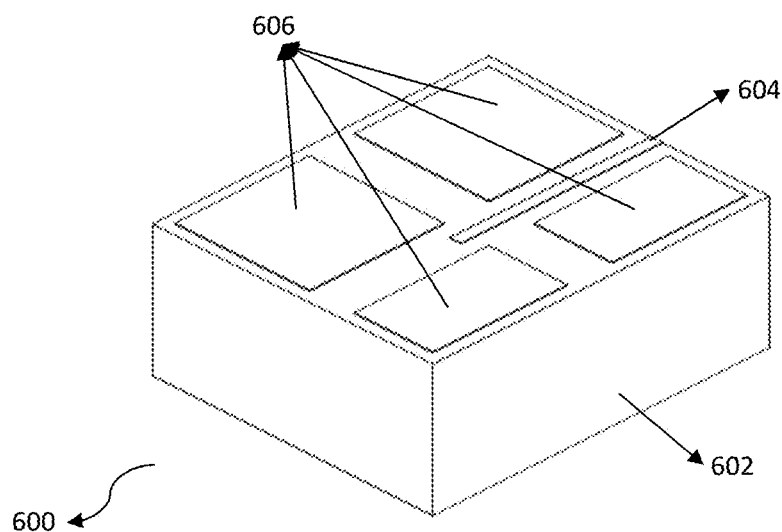
FIGS. 6A and 6B illustrate an exemplary environment including a laser diode chip of an embodiment of light source assembly which can be used in the three dimensional active alignment, in accordance with an embodiment of the present disclosure.
Figure 6B:
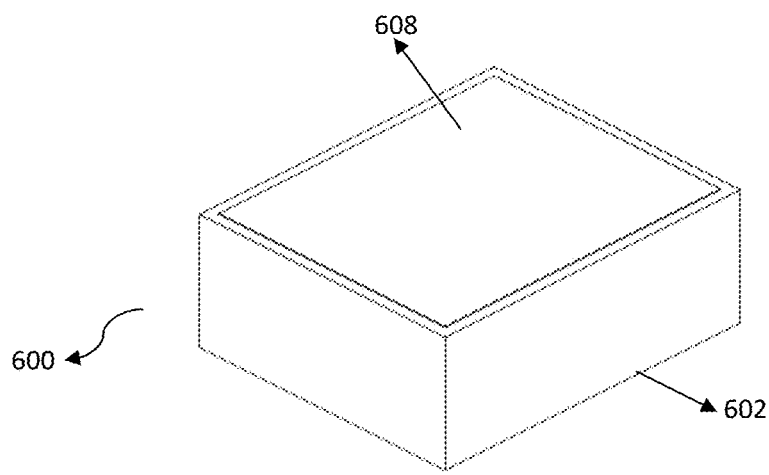

FIGS. 6A and 6B illustrate an exemplary environment including a laser diode chip of an embodiment of light source assembly which can be flip chipped assembled on the sub-mount of the light source assembly, in accordance with an embodiment of the present disclosure. As shown in the FIGS. 6A and 6B, a laser diode chip 600 includes a substrate 602. The laser diode configurates as a waveguide 604 for laser ejecting, metal pads 606 at two sides of the waveguide 604 and a sheet metal layer 608 on the opposite side of the light ejecting waveguide 604.

Figure 7:
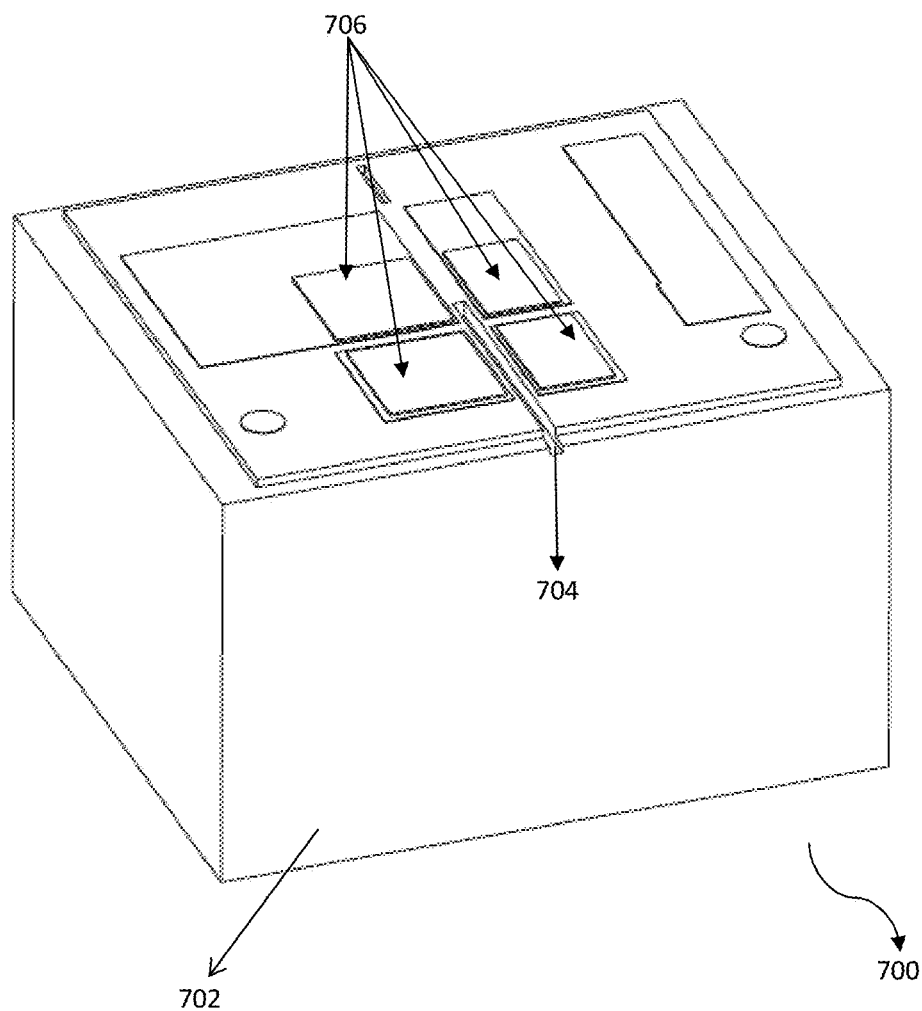
FIG. 7 illustrate an exemplary environment showing a sub-mount for accommodating a flip chipped laser diode chip of a light source assembly, in accordance with an embodiment of the present disclosure.

FIG. 7 illustrate an exemplary environment showing an embodiment of light source assembly including a sub-mount for accommodating a flip chipped laser diode chip 600 of a light source assembly, in accordance with an embodiment of the present disclosure. The light source assembly 700 includes a sub-mount 702. The sub-mount 702 has a recess 704 in the corresponding position of the waveguide to provide enough room for waveguide to prevent it from damage or contamination during assembly process. The flip chipped laser diode chip 600 is mounted on the sub-mount 702 by using eutectic bonding between corresponding metal pads 706.

Figure 8A:
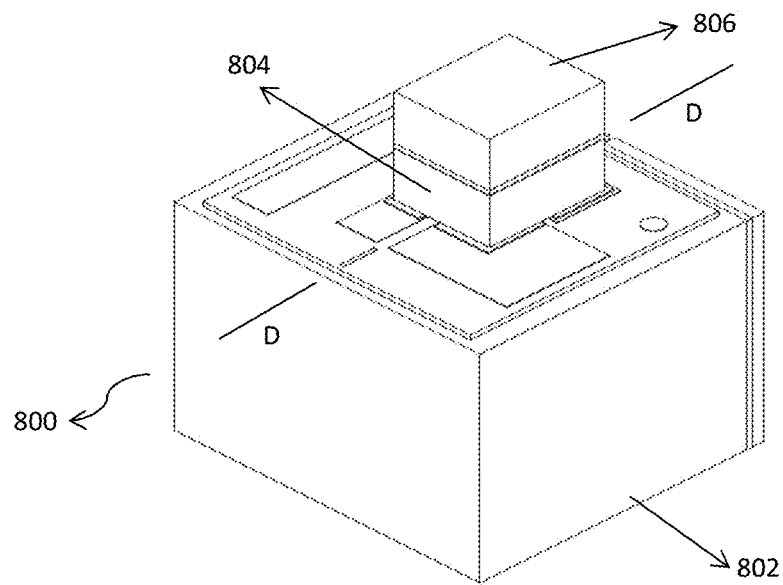
FIGS. 8A and 8B illustrate an exemplary environment showing a light source assembly by using a flip chipped laser diode chip with a thermal block, in accordance with an embodiment of the present disclosure.
Figure 8B:
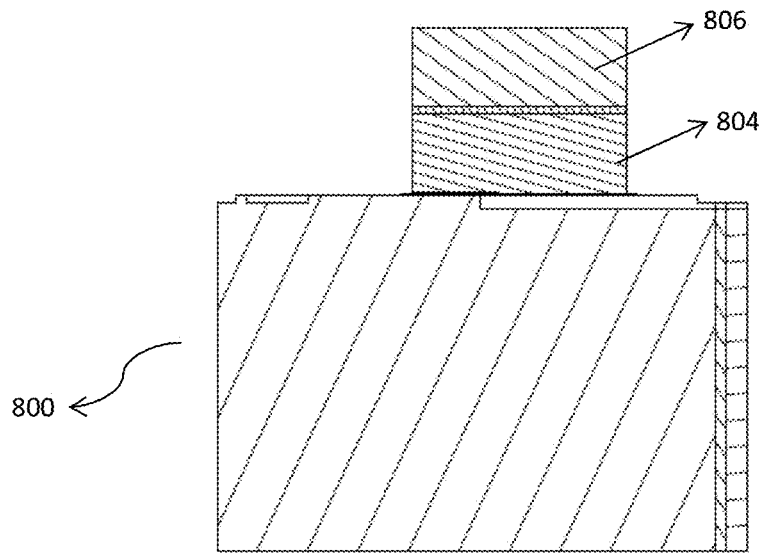

FIGS. 8A and 8B illustrate an exemplary environment showing a flip chipped laser diode chip with a thermal block, in accordance with an embodiment of the present disclosure. Referring to the FIGS. 8A and 8B, the light source assembly 800 includes a sub-mount 802 with a flip chipped laser diode chip 804 provided with a thermal block 806 eutecticaly bonded on the top of laser diode chip 804 with good thermal joint by a sheet metal on it. The thermal block 806 increases the thermal capacitance and enhances the heat dissipation from the laser diode chip 804. FIG. 8B shows cross sectional view along a section D-D of the light source assembly 800.

Figure 9:
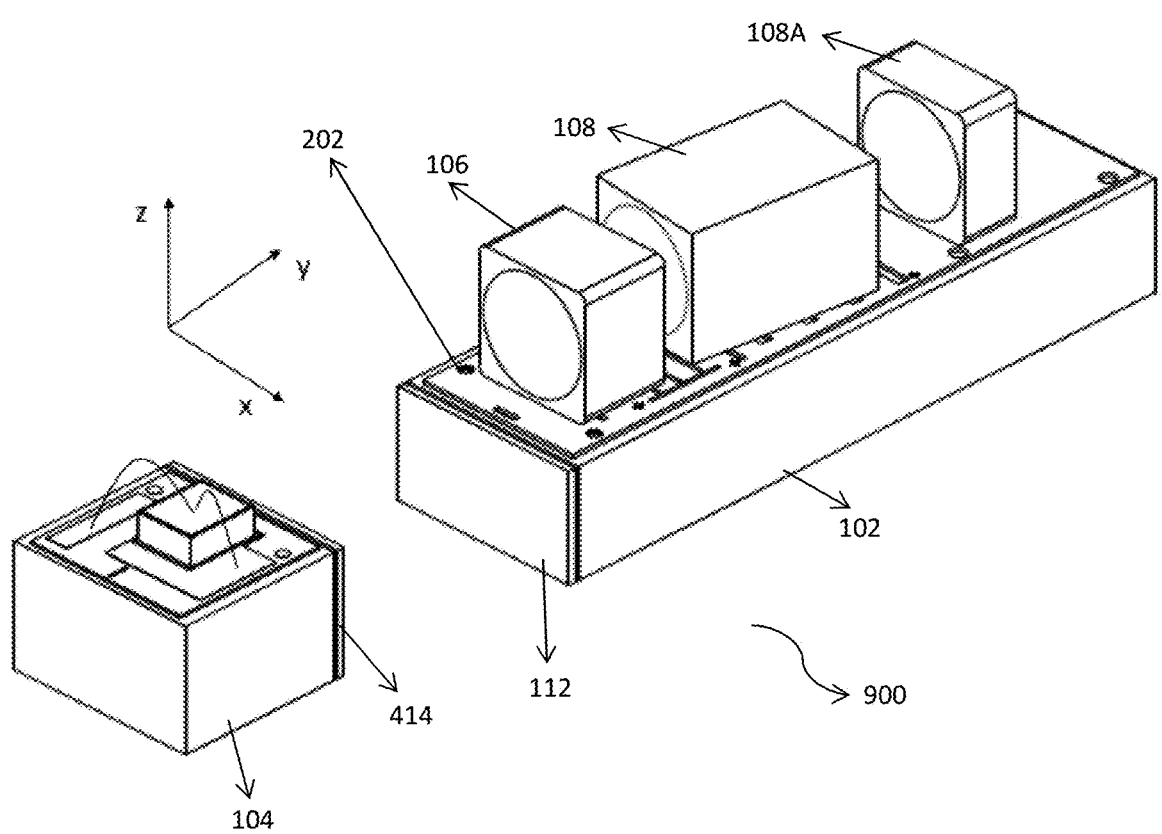
FIG. 9 illustrates an exemplary environment including an exploded perspective view of the TOSA, which can be used as the process illustration of an assembly of the light source assembly to the optical bench, in accordance with an embodiment of the present disclosure.

FIG. 9 illustrates an exemplary environment including an exploded perspective view of the TOSA, which can be used as the process illustration of an assembly of the light source assembly to the optical bench, in accordance with an embodiment of the present disclosure. The exploded view 900 shows collimator lens 106 and other optical components (108, etc) passively aligned to the alignment marks 202 on the surface of optical bench 102. This ensures the lens 106 is positioned at the proper position towards the edge 112 of the optical bench 102. Further, the other optical components (108 etc.), along with the collimator lens 106 and the optical path 118 are aligned with each other. The light source assembly 104 is actively aligned towards the collimator lens 106 to ensure the light from light source goes along the optical path 118. The light source assembly 104 is first aligned in X and Z direction by detecting the light intensity passing through the optical path 118 and then pushed, along the actively aligned position and plane with optical path, towards the edge 112 of the optical bench 102 to make contact via the solder joint. Laser welding is implemented to locally melt the solder on the edge 112 of the bench 102. The melt solder is wetted by gold on both edges (112 and 414) of the optical bench 102 and light source sub-mount 402 so that the joint is made.

This method can be also used to assemble the CWDM TOSA which has multiple channels.

Figure 10:
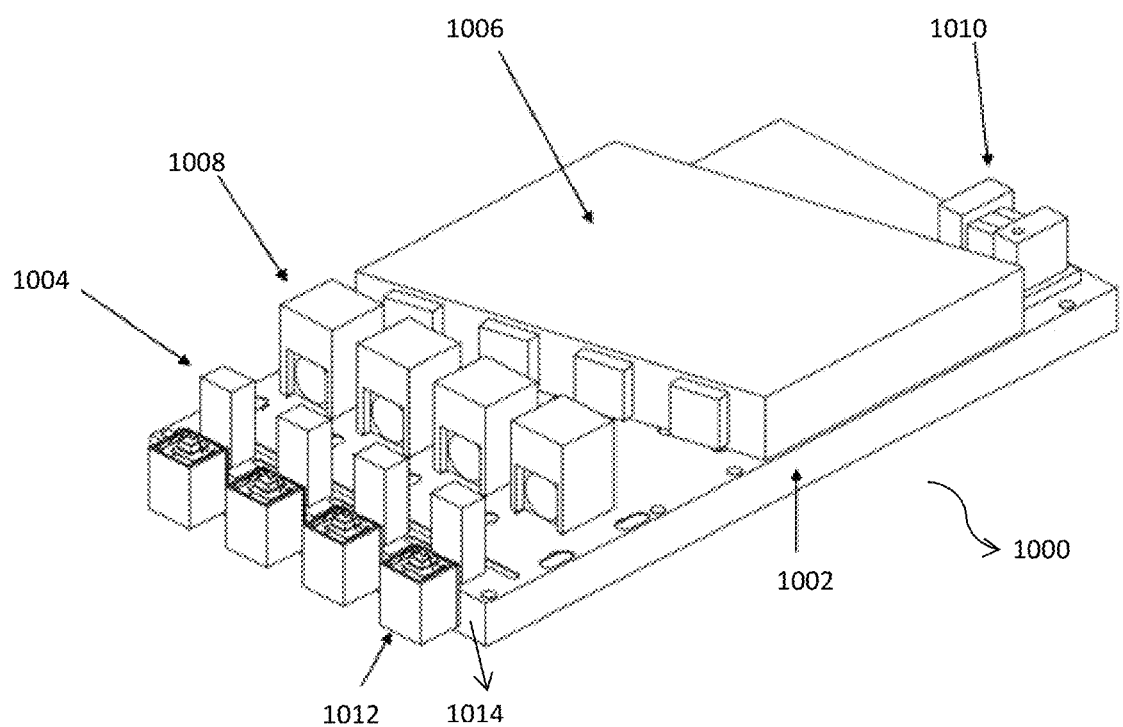
FIG. 10 illustrates an exemplary environment showing a perspective view of an assembly of CWDM TOSA, in accordance with an embodiment of the present disclosure.

FIG. 10 illustrates an exemplary environment showing a perspective view of an assembly of CWDM TOSA, in accordance with an embodiment of the present disclosure. The perspective view 1000 shows the CWDM which combined four wavelengths signals into one for transmission along fiber cables. On an optical bench 1002, optical components are secured. Such as, collimator lenses or lens array 1004 to collimate the four wavelengths light beams and guide them into a multiplexer (MUX) 1006, which is also on the surface of the bench 1002. A set of compensators 1008 is inserted into the optical path, which is the position between the collimator 1004 and MUX 1006. The compensators 1008 are the lenses with long focus distance which can adjust the collimated beam away from its original position in a certain range without changing its collimated property. The MUX 1006 combines the light beams with different wavelength into one light beam by multiple reflections and filtering. After coming out of MUX 1006, a single light beam which carries the four wavelengths enters an optical fiber by the assistance of other optical components on the bench 1002 (isolator 1010, lens, etc.).

In this CWDM TOSA, four light source assemblies 1012 are assembled to an edge 1014 of the optical bench 1002 by the same three-dimensional active alignment method, as described above in the FIGS. 1-9. After that, the compensator 1008 is adjusted to further modify the light beams to ensure they enter the MUX 1006 with a good optical alignment.

Figure 11:
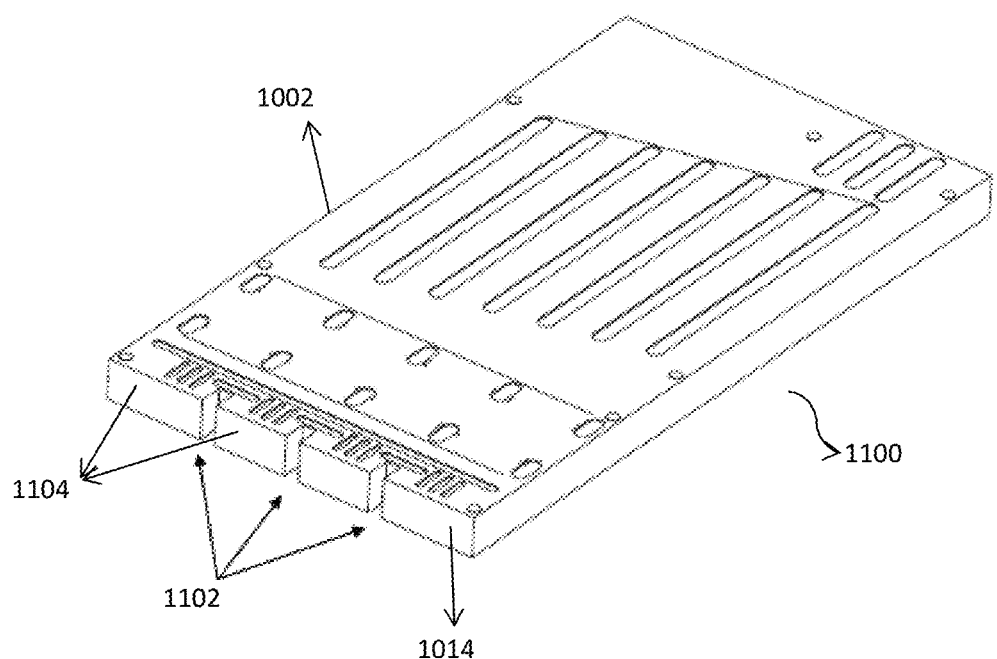
FIG. 11 illustrates a perspective view of optical bench for CWDM, in accordance with an embodiment of the present disclosure.

FIG. 11 illustrates a perspective view of the optical bench for CWDM, in accordance with an embodiment of the present disclosure. Same as the single channel bench shown in FIG. 10, there are also the alignment marks, epoxy slots on the top surface of the bench and solder with adhesive layer on the edge of the bench, as shown in the perspective view 1100. There are additional separation slots 1102 on the edge 1014 of the bench 1002. These slots 1102 pass through the bench 1002 from top to bottom surface to separate the continuous edge 1014 into different islands 1104 for different light source assemblies 1012. With these separation slots, the heat energy applied to melt the solder can be occupied at every island 1104 and be prevented from dissipating fast, making the solder welding process possible.

Figure 12:
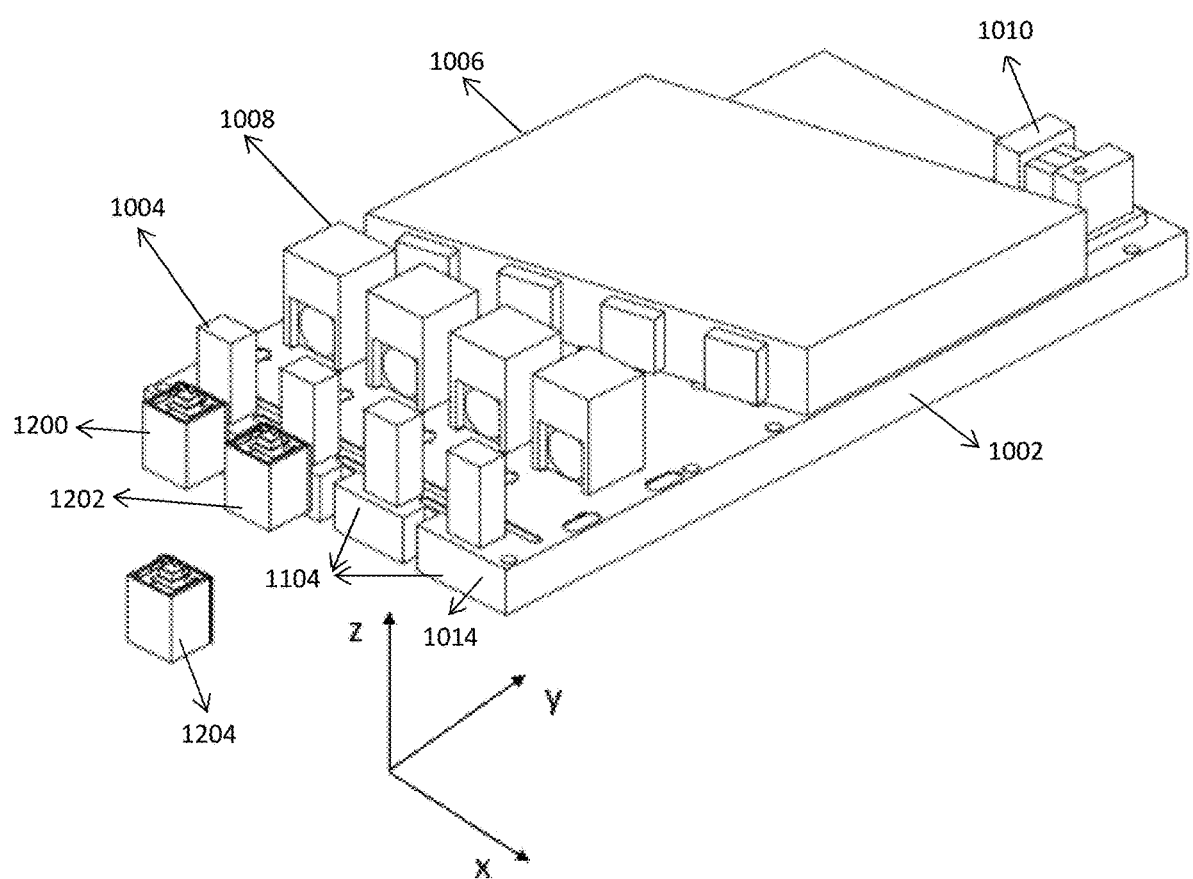
FIG. 12 illustrates a partially assembled CWDM TOSA which can be used to illustrate the assembly process, in accordance with an embodiment of the present disclosure.

FIG. 12 illustrates a partially assembled CWDM TOSA which can be used to illustrate the assembly process, in accordance with an embodiment of the present disclosure. The collimator lenses or lens array 1004 is first deposited on the surface of bench 1002 by passive alignment based on the alignment marks to ensure its position on corresponding optical path and the distance toward the edge 1014. The MUX 1006 is also passive aligned on the bench 1002 together with the isolator 1010 and lens 1004 for guiding the combined light beam to optical fiber. Compensator 1008 is deposited on a temporary position at this stage.

In the FIG. 12, two light source assemblies 1200 and 1202 have been assembled onto the edge 1014 of the optical bench 1002 in their corresponding island 1104. The FIG. 12 illustrates a third light source assembly 1204 alignment. The light source assembly 1204 can be moved in X and Z directions in order to align to its own optical path and then, move towards the edge 1014 of the bench 1002 to make contact. Laser welding is implemented to melt the solder on the edge 1014 of the bench 1002. The separation slot 1102 can prevent the heat dissipate to other island so that the heat can focus on desired position to melt the solder on the island. The melt solder is wetted on the gold on both edges of the optical bench and the light source sub-mount so that the joint is made.

As told above, the final step is adjusting the compensator 1008. The compensator 1008 is also actively aligned until the optimum light intensity is achieved. Then the compensator 1008 is fixed on the bench 1002 by epoxy, the Z direction of the compensator 1008 is adjusted by the thickness of the epoxy.

Figure 13:
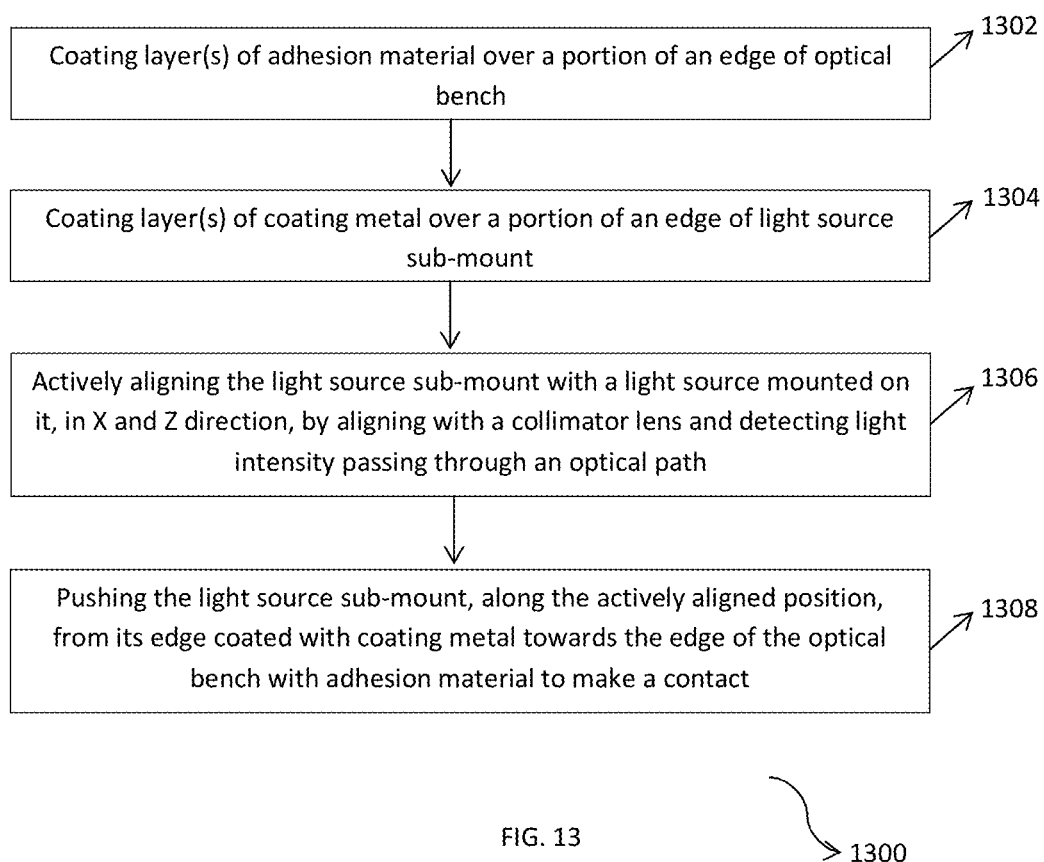
FIG. 13 illustrates a flow chart showing a method for active alignment of the light source assembly along the edge of the optical bench, in accordance with an embodiment of the present disclosure.

FIG. 13 illustrates a flow chart showing a method for active alignment of the light source assembly along the edge of the optical bench, in accordance with an embodiment of the present disclosure. The steps of the method 1300 are read and understood in conjunction with the FIGS. 1-12. The method 1300 includes a step 1302 where the edge 112 of the optical bench 102 is coated with layer(s) of an adhesion material. The adhesion material may be a soldering material. Further, the adhesion material may be deposited or layered over a portion of the edge of the optical bench 102, or over the entire surface of the edge of the optical bench. In an embodiment, patterned solders are made on the edge of the optical bench. To improve the adhesion of the soldering material to the edge 112 of the optical bench 102, multiple layers of an adhesive metal are deposited first. The adhesive metal layer may be of metals including and not limiting to Ti/Au, TiW/Au and Cr/Au. Further, gold layer is used for solder wetting during welding process.

In a next step 1304, an edge of the light source sub-mount of the light source assembly is coated with a coating metal, usually with multiple metal layers. The coating metal may be including and not limited to Ti/Au, TiW/Au, Cr/Au, etc. The titanium is used as an adhesion layer and the gold is used as a wetting surface for a solder joint between the light source sub-mount 402 with the optical bench 102. These multiple layers of coating metal are coated first on the edge 414 of the light source sub-mount 402. Further, the light source assembly 104 with the light source sub-mount 402 is actively aligned in three dimensions along an optical path 118 across the edge of the optical bench 102, in step 1306. In an embodiment, the collimator lens 106 and other optical components (108, etc) are passively aligned to the alignment marks 202 on the surface of optical bench 102 first for ensuring proper positioning of the components in the optical path 118, and then the light source sub-mount 402 is actively aligned in three dimensions. For active alignment of the light source sub-mount 402, it is first aligned towards the collimator lens 106 to ensure the light from light source goes along the optical path 118. The light source assembly 102 is aligned in X and Z direction by detecting the light intensity passing through the optical path 118. Thereafter at step 1308, the light source sub-mount 402 is pushed, along the actively aligned position and plane with optical path in step 1308, towards the edge 112 of the optical bench 102 to make contact via the solder joint. Laser welding is implemented to locally melt the solder on the edge 112 of the bench 102 in step 1308. The melt solder is wetted by gold on both edges (112 and 414) of the optical bench 102 and light source sub-mount 402 so that the joint is made Advantageously, the present disclosure provides a TOSA structure showing that the key component, i.e., laser diode light source, can be three dimensional aligned into the optical path. Different from the conventional subassembly method that the light source is attached on the surface of the sub-mount and is aligned along the optical path only in longitudinal and transection direction in plane, the present structure shows the laser diode source on the laser diode sub-mount, where the sub-mount is attached on the edge of the optical bench can be aligned even in the vertical direction of the plane. The alignment method can be implemented to both single channel and multiple channel TOSA assembly.

What is claimed is:

1. A system for packaging a transmitter optical subassembly, in optical transmission, comprising:
    an optical bench provided with multiple alignment marks and slots on a top surface of the optical bench for aligning and securing multiple optical components;
    a first edge of the optical bench coated, at least partially, with an adhesion material; and
    a light source assembly mounted with a light source, and having an opposite second edge coated, at least partially, with a coating metal,
    wherein the light source assembly is actively aligned along three dimensions in an optical path, the actively aligning of the light source assembly comprises:
    (a) actively aligning, the light source assembly in X and Z directions along the optical path, by moving the light source in the X and Z directions for aligning with multiple optical components that are passively aligned on the multiple alignment marks provided on the optical bench; and
    (b) pushing the light source assembly, along the actively aligned position of step (a), towards the first edge of the optical bench from the opposite second edge of the light source assembly, for making an adhering contact between the optical bench and the light source assembly, across the first and the opposite second edges of the optical bench and the light source assembly respectively, using an adhesion process;
    wherein the transmitter optical subassembly is a multiple channeled coarse wavelength division multiplexing 4-wavelength (CWDM) transmitter optical subassembly, and wherein the optical components include collimator lenses or a lens array, a compensator, an isolator, a multiplexer, and other optical components and wherein the CWDM transmitter optical subassembly includes an optical bench with a first edge provided with a plurality of the separation slots passing through the optical bench from the top surface to a bottom surface to separate the continuous first edge into different multiple islands for different light source assemblies, confine heat at each island, and to prevent the heat from dissipating into an adjacent island during solder welding.

2. The system of claim 1, wherein the slots on the top surface of the optical bench are filled with epoxy for securely attaching the optical components to the optical bench, while avoiding any effect on vertical assemble positions of the optical components due to a thickness of the epoxy.

3. The system of claim 1, wherein the optical bench is made of silicon and wherein the light source of the light source assembly is a laser diode.

4. The system of claim 1, wherein the adhesion material coated, at least partially, on the first edge of the optical bench is one of Ti/Au/solder, TiW/Au/solder or Cr/Au/solder, and wherein gold is used for solder wetting during a welding process.

5. The system of claim 1, wherein the first edge of the optical bench has multiple recesses filled with an adhesion material for providing patterned coating of the adhesion material on the first edge of the optical bench, and wherein the adhesion material is embedded into the recesses without extruding out of a surface of the first edge.

6. The system of claim 1, wherein the adhesion process is a welding process, and wherein the adhesion material coated over the first edge of the optical bench makes welded contact with the coating metal coated over the opposite second edge of the light source assembly during the welding process.

7. The system of claim 1, wherein the coating metal is at least one of Ti/Au, TiW/Au or Cr/Au, and wherein Ti, TiW or Cr is used as an adhesion layer and gold is used as a wetting surface for a solder joint between the light source assembly with the optical bench.

8. The system of claim 1, wherein the actively aligning of the light source assembly along the three dimensions includes passively aligning the optical components on the alignment marks provided on the optical bench to position the optical components along the first edge of the optical bench, and to align them with the optical path, prior to actively aligning the light source assembly in the X and Z directions along the optical path in step (a).

9. The system of claim 1, wherein actively aligning the light source assembly along the three dimensions further includes adjusting the compensator by actively aligning it until an optimum light intensity is achieved, and fixing the compensator on the optical bench by epoxy, and wherein the Z direction of the compensator is adjusted by a thickness of the epoxy.

10. A method for packaging a transmitter optical subassembly, in optical transmission to implement active alignment, the method comprising:

coating, at least partially, a first edge of an optical bench with an adhesion material;

coating, at least partially, an opposite second edge of a light source assembly mounted with a laser diode, with a coating metal;

aligning multiple optical components on multiple alignment marks and slots provided on a top surface of the optical bench, the aligning of the optical components includes aligning the optical components passively along an optical path;

actively aligning the light source assembly in X and Z directions along the optical path, by moving the laser diode in the X and Z directions for aligning with multiple optical components that are passively aligned on the multiple alignment marks provided on the optical bench; and pushing the light source assembly, along the actively aligned position of the light source assembly, towards the first edge of the optical bench from the opposite second edge of the light source assembly, for making an adhering contact between the optical bench and the light source assembly, across the first and the opposite second edges of the optical bench and the light source assembly respectively, using an adhesion process;

wherein the laser diode is provided with a waveguide for laser emission, the waveguide is arranged in a surface of a laser diode chip, where the laser diode chip includes metal pads positioned at two sides of the waveguide; and a sheet metal layer on an opposite side of the waveguide.

11. The method of claim 10, wherein the adhesion material coated, at least partially, on the first edge of the optical bench and the coating metal coated, at least partially on the opposite second edge of the light source assembly are at least one of Ti/Au, TiW/Au, or Cr/Au, and wherein Ti, TiW or Cr is used as an adhesion layer and gold is used as a wetting surface for a solder joint between the light source assembly with the optical bench.

12. The method of claim 10, wherein the light source assembly comprises a sub-mount, where the sub-mount further includes a recess on a surface of the sub-mount to accommodate the waveguide of the laser diode chip; and metal pads positioned corresponding to the metal pads on the laser diode chip.

13. The method of claim 10, wherein the laser diode chip is flip-chip mounted on a sub-mount of the light source assembly by using eutectic bonding between the corresponding metal pads.

14. The method of claim 13, wherein the flip-chip mounted laser diode is provided with a thermal block on a top surface of the flip-chip mounted laser diode, and wherein the thermal block is attached with a thermal joint by a sheet metal on the flip-chip mounted laser diode.

15. A system for packaging transmitter optical subassembly, in optical transmission, comprising:
an optical bench provided with multiple alignment marks and slots on a top surface of the optical bench for aligning and securing multiple optical components;
a first edge of the optical bench coated, at least partially, with an adhesion material; and
a light source assembly mounted with a laser diode, and having an opposite second edge coated, at least partially, with a coating metal,
wherein the light source assembly is actively aligned along three dimensions to the optical bench in an optical path, and wherein the three dimensions are X, Y and Z along the optical bench and in optical path;
wherein the transmitter optical subassembly is a multiple channeled coarse wavelength division multiplexing 4-wavelength (CWDM) transmitter optical subassembly, and wherein the optical components include collimator lenses or a lens array, a compensator, an isolator, a multiplexer, and other optical components and wherein the CWDM transmitter optical subassembly includes an optical bench with a first edge provided with a plurality of the separation slots passing through the optical bench from the top surface to a bottom surface to separate the continuous first edge into different multiple islands for different light source assemblies, confine heat at each island, and to prevent the heat from dissipating into an adjacent island during solder welding.

16. The system of claim 15, wherein the light source assembly is actively aligned along the three dimensions to the optical bench in an optical path by:
(a) actively aligning, the light source assembly, in X and Z directions along the optical path, by moving the laser diode in the X and Z directions for aligning with multiple optical components that are passively aligned on the multiple alignment marks provided on the optical bench; and
(b) pushing the light source assembly, along the actively aligned position of step (a), towards the first edge of the optical bench from the opposite second edge of the light source assembly, for making an adhering contact between the optical bench and the light source assembly, across the first and the opposite second edges of the optical bench and the light source assembly respectively, using an adhesion process.

17. A method for packaging a transmitter optical subassembly implementing active alignment, in optical transmission, the method comprising:
coating, at least partially, a first edge of an optical bench with an adhesion material;
coating, at least partially, an opposite second edge of a light source assembly mounted with a laser diode, with a coating metal;
aligning multiple optical components on multiple alignment marks and slots provided on a top surface of the optical bench, the aligning of the optical components include aligning the optical components passively along an optical path; and
actively aligning the light source assembly along three dimensions to the optical bench in an optical path, and wherein the three dimensions are X, Y and Z along the optical bench and in optical path;
wherein the laser diode is provided with a waveguide for laser emission, the waveguide is arranged in a surface of a laser diode chip, where the laser diode chip includes metal pads positioned at two sides of the waveguide; and a sheet metal layer on an opposite side of the waveguide.

18. The method of claim 17 further comprises:
(a) actively aligning, the light source assembly, in X and Z directions along the optical path, by moving the laser diode in the X and Z directions for aligning with multiple optical components that are passively aligned on the multiple alignment marks provided on the optical bench; and
(b) pushing the light source assembly, along the actively aligned position of step (a), towards the first edge of the optical bench from the opposite second edge of the light source assembly, for making an adhering contact between the optical bench and the light source assembly, across the first and the opposite second edges of the optical bench and the light source assembly respectively, using an adhesion process.

* * * * *